(12) United States Patent
Yun et al.

(10) Patent No.: US 11,684,955 B2
(45) Date of Patent: Jun. 27, 2023

(54) CHEMICAL SUPPLY UNIT, SUBSTRATE PROCESSING APPARATUS, AND SUBSTRATE PROCESSING METHOD

(71) Applicant: SEMES CO., LTD., Chungcheongnam-do (KR)

(72) Inventors: Tae Suk Yun, Chungcheongnam-do (KR); Hyeon Suk Park, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 207 days.

(21) Appl. No.: 17/138,301

(22) Filed: Dec. 30, 2020

(65) Prior Publication Data

US 2021/0197237 A1    Jul. 1, 2021

(30) Foreign Application Priority Data

Dec. 31, 2019  (KR) ........................ 10-2019-0179872

(51) Int. Cl.
| | |
|---|---|
| *B08B 3/08* | (2006.01) |
| *B08B 3/02* | (2006.01) |
| *B08B 13/00* | (2006.01) |
| *B08B 3/10* | (2006.01) |
| *H01L 21/67* | (2006.01) |

(52) U.S. Cl.
CPC ............... *B08B 3/08* (2013.01); *B08B 3/02* (2013.01); *B08B 3/10* (2013.01); *B08B 13/00* (2013.01); *B08B 2203/007* (2013.01); *H01L 21/67017* (2013.01); *H01L 21/67051* (2013.01)

(58) Field of Classification Search
CPC .. B08B 3/08; B08B 3/02; B08B 13/00; B08B 3/10; B08B 2203/007; H01L 21/67017; H01L 21/67051
See application file for complete search history.

(56) References Cited

U.S. PATENT DOCUMENTS

| | | | |
|---|---|---|---|
| 2008/0107796 A1* | 5/2008 | Cho ................... | B05C 11/1013 118/710 |
| 2009/0078582 A1* | 3/2009 | Kobayashi ........ | H01L 21/67051 204/263 |
| 2009/0229641 A1* | 9/2009 | Yoshida ................... | B08B 3/14 134/107 |

(Continued)

FOREIGN PATENT DOCUMENTS

| | | |
|---|---|---|
| KR | 10-0926159 B1 | 11/2009 |
| KR | 10-2011-0065299 A | 6/2011 |

(Continued)

OTHER PUBLICATIONS

Machine Translation of KR1020110065299 to Eshima, Jun. 2011. (Year: 2011).*

*Primary Examiner* — Benjamin L Osterhout
(74) *Attorney, Agent, or Firm* — Procopio, Cory, Hargreaves & Savitch LLP (57) ABSTRACT

An apparatus for processing a substrate includes a housing having a processing space in which the substrate is processed, a support unit that supports the substrate in the processing space, a nozzle that dispenses a chemical onto the substrate placed on the support unit, a chemical supply unit that supplies the chemical to the nozzle, and a controller that controls the chemical supply unit.

10 Claims, 10 Drawing Sheets

(56) References Cited

U.S. PATENT DOCUMENTS

| | | | | |
|---|---|---|---|---|
| 2014/0120264 A1* | 5/2014 | Inatomi | ............... | C23C 18/1683 |
| | | | | 118/712 |
| 2015/0380280 A1* | 12/2015 | Amiya | ................ | B01F 35/2213 |
| | | | | 137/613 |
| 2016/0368030 A1* | 12/2016 | Kim | ........................ | B01F 23/49 |
| 2019/0198356 A1* | 6/2019 | Higuchi | ............ | H01L 21/67017 |
| 2019/0371628 A1* | 12/2019 | Yasuda | ............. | H01L 21/67023 |

FOREIGN PATENT DOCUMENTS

| | | |
|---|---|---|
| KR | 1020110136677 A | 12/2011 |
| KR | 1020130007151 A | 1/2013 |
| KR | 10-1342960 B1 | 12/2013 |
| KR | 101747035 B1 | 6/2017 |
| KR | 102025979 B1 | 9/2019 |

\* cited by examiner

CHEMICAL SUPPLY UNIT, SUBSTRATE PROCESSING APPARATUS, AND SUBSTRATE PROCESSING METHOD

CROSS-REFERENCE TO RELATED APPLICATIONS

A claim for priority under 35 U.S.C. § 119 is made to Korean Patent Application No. 10-2019-0179872 filed on Dec. 31, 2019, in the Korean Intellectual Property Office, the entire contents of which are hereby incorporated by reference.

BACKGROUND

Embodiments of the inventive concept described herein relate to a chemical supply unit for supplying a chemical to a nozzle for dispensing the chemical onto a substrate, a substrate processing apparatus including the chemical supply unit, and a substrate processing method for processing a substrate using the substrate processing apparatus.

Contaminants (e.g., particles, organic contaminants, metal contaminants, or the like) that remain on a surface of a substrate greatly affect characteristics and production yields of semiconductor elements. Due to this, a cleaning process of removing various types of contaminants adhering to a substrate surface is emerging as a major issue in semiconductor manufacturing processes. The cleaning process is performed before and after each unit process of manufacturing semiconductor elements. In general, the cleaning process includes a chemical treatment process of removing metal foreign matter, organic matter, particles, or the like remaining on a substrate using a chemical, a rinsing process of removing the chemical remaining on the substrate using deionized water, and a drying process of drying the substrate using nitrogen gas, or the like.

In the chemical treatment process, a chemical supply unit supplies the chemical to a nozzle unit. In general, the chemical supply unit includes a tank that stores the chemical, a supply line through which the chemical is supplied from an interior space of the tank to the nozzle unit, a recovery line through which the chemical used to process the substrate is recovered into the interior space of the tank, and the like. To prevent the supply of the chemical from being stopped, two or more tanks are provided, and the chemical stored in each of the tanks is drained through a drain line connected to the tank.

However, when the level of the chemical stored in the tank does not reach a predetermined level, the chemical in the tank cannot be circulated and is completely drained. Accordingly, a large amount of chemical may be unnecessarily wasted.

SUMMARY

Embodiments of the inventive concept provide a chemical supply unit for reducing the amount of a chemical unnecessarily drained from the chemical supply unit, a substrate processing apparatus, and a substrate processing method using the substrate processing apparatus.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an embodiment, an apparatus for processing a substrate includes a housing having a processing space in which the substrate is processed, a support unit that supports the substrate in the processing space, a nozzle that dispenses a chemical onto the substrate placed on the support unit, a chemical supply unit that supplies the chemical to the nozzle, and a controller that controls the chemical supply unit. The chemical supply unit includes a tank having an interior space in which the chemical is stored, a sensor that detects a residual amount of the chemical stored in the interior space of the tank, an inlet line through which the chemical is supplied from a chemical supply source to the interior space of the tank and in which an inlet valve is installed, an outlet line through which the chemical is supplied from the interior space of the tank to the nozzle and in which an outlet valve is installed, and a drain line through which the chemical in the interior space of the tank is drained and in which a drain valve is installed. The controller controls the chemical supply unit to supply a new chemical from the chemical supply source to the tank in a state in which the chemical remains in the interior space of the tank, when the residual amount detected by the sensor reaches a first preset amount or less.

According to an embodiment, the controller may determine whether the number of times that the chemical remaining in the tank and the new chemical supplied to the tank are mixed with each other exceeds a preset number of times and may control the chemical supply unit to drain the remaining chemical in the interior space of the tank through the drain line, when the number of times that the chemical remaining in the tank and the new chemical supplied to the tank are mixed with each other exceeds the preset number of times and the residual amount detected by the sensor reaches a second preset amount or less.

According to an embodiment, the first preset amount may be equal to the second preset amount.

According to an embodiment, the first preset amount may be set to 5% to 15% of a chemical amount that the tank is able to store.

According to an embodiment, the tank may include a first tank and a second tank, and the chemical supply unit may further include a circulation line that circulates the chemical stored in one of the first tank and the second tank when the other tank receives the chemical from the chemical supply source through the inlet line, supplies the chemical to the nozzle through the outlet line, or drains the chemical through the drain line.

According to an embodiment, the circulation line may include a heater that heats the chemical flowing through the circulation line and a pressure-reducing member that delivers the chemical stored in the first tank or the second tank to the heater.

According to an embodiment, a chemical supply unit for supplying a chemical includes a tank having an interior space in which the chemical is stored, a sensor that detects a residual amount of the chemical stored in the interior space of the tank, an inlet line through which the chemical is supplied from a chemical supply source to the interior space of the tank and in which an inlet valve is installed, an outlet line through which the chemical is supplied from the interior space of the tank to an object to be processed and in which an outlet valve is installed, a drain line through which the chemical in the interior space of the tank is drained and in which a drain valve is installed, and a controller that controls the chemical supply unit. The controller controls the chemical supply unit to supply a new chemical from the chemical supply source to the tank in a state in which the chemical remains in the interior space of the tank, when the residual amount detected by the sensor reaches a first preset amount or less.

According to an embodiment, the controller may determine whether the number of times that the chemical remaining in the tank and the new chemical supplied to the tank are mixed with each other exceeds a preset number of times and may control the chemical supply unit to drain the remaining chemical in the interior space of the tank through the drain line, when the number of times that the chemical remaining in the tank and the new chemical supplied to the tank are mixed with each other exceeds the preset number of times and the residual amount detected by the sensor reaches a second preset amount or less.

According to an embodiment, the first preset amount may be equal to the second preset amount.

According to an embodiment, the first preset amount may be set to 5% to 15% of a chemical amount that the tank is able to store.

According to an embodiment, the tank may include a first tank and a second tank, and the chemical supply unit may further include a circulation line that circulates the chemical stored in one of the first tank and the second tank when the other tank receives the chemical from the chemical supply source through the inlet line, supplies the chemical through the outlet line to the object to be processed, or drains the chemical through the drain line.

According to an embodiment, the circulation line may include a heater that heats the chemical flowing through the circulation line and a pressure-reducing member that delivers the chemical stored in the first tank or the second tank to the heater.

According to an embodiment, a method for processing a substrate includes processing the substrate by dispensing a chemical stored in a tank onto the substrate, in which a new chemical is supplied into the tank and mixed with the chemical remaining in the tank when a residual amount of the chemical in the tank reaches a preset chemical amount or less, and a mixture of the new chemical and the remaining chemical is dispensed onto the substrate.

According to an embodiment, the entire chemical in the tank may be drained when the number of times that the remaining chemical in the tank and the new chemical are mixed with each other exceeds a preset number of times and the residual amount of the chemical in the tank reaches the preset chemical amount or less.

According to an embodiment, a method for processing a substrate includes processing the substrate by dispensing the chemical stored in the tank onto the substrate, in which the new chemical is supplied into the tank and mixed with the chemical remaining in the tank when the residual amount of the chemical in the tank reaches a preset chemical amount or less, and a mixture of the new chemical and the remaining chemical is dispensed onto the substrate.

According to an embodiment, the entire chemical in the tank may be drained when the number of times that the remaining chemical in the tank and the new chemical are mixed with each other exceeds a preset number of times and the residual amount of the chemical in the tank reaches the preset chemical amount or less.

According to an embodiment, the preset chemical amount may be set to 5% to 15% of a chemical amount that the tank is able to store.

According to an embodiment, the tank may include a first tank and a second tank.

According to an embodiment, the chemical supply unit may further include a circulation line that circulates the chemical stored in one of the first tank and the second tank when the other tank receives the chemical from the chemical supply source through the inlet line, supplies the chemical to the substrate through the outlet line, or drains the chemical through the drain line.

According to an embodiment, the circulation line may include a heater that heats the chemical flowing through the circulation line and a pressure-reducing member that delivers the chemical stored in the first tank or the second tank to the heater.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that the inventive concept will be thorough and complete, and will fully convey the scope of the inventive concept to those skilled in the art. In the drawings, the dimensions of components are exaggerated for clarity of illustration.

Hereinafter, embodiments of the inventive concept will be described in detail with reference to FIGS. 1 to 18.

Figure 1:
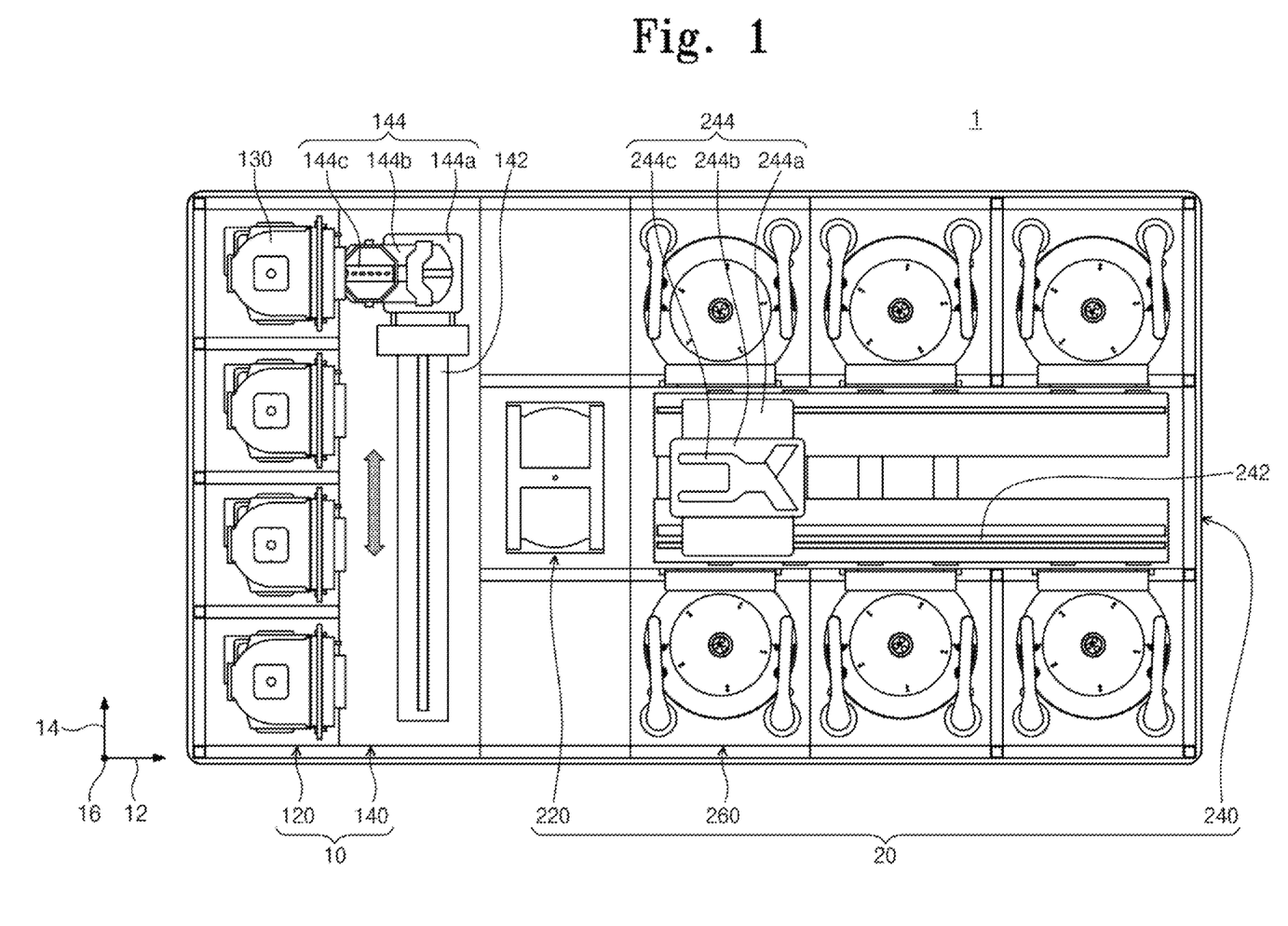
FIG. 1 is a schematic plan view illustrating one example of substrate processing equipment equipped with process chambers according to an embodiment of the inventive concept.

FIG. 1 is a schematic plan view illustrating substrate processing equipment 1 of the inventive concept.

Referring to FIG. 1, the substrate processing equipment 1 includes an index module 10 and a processing module 20. The index module 10 includes load ports 120 and a transfer frame 140. The load ports 120, the transfer frame 140, and the processing module 20 are sequentially arranged in a row. Hereinafter, a direction in which the load ports 120, the transfer frame 140, and the processing module 20 are arranged is referred to as a first direction 12. A direction perpendicular to the first direction 12 when viewed from above is referred to as a second direction 14, and a direction perpendicular to a plane including the first direction 12 and the second direction 14 is referred to as a third direction 16.

Carriers 130, each of which has substrates W received therein, are seated on the load ports 120. The load ports 120 are disposed in a row along the second direction 14. FIG. 1 illustrates an example that the index module 10 includes four load ports 120. However, the number of load ports 120 may be increased or decreased depending on conditions such as process efficiency and footprint of the processing module 20. Each of the carriers 130 has slots (not illustrated) that support edges of the substrates W. The slots are arranged along the third direction 16, and the substrates W are stacked one above another with a spacing gap therebetween along the third direction 16 in the carrier 130. A front opening unified pod (FOUP) may be used as the carrier 130.

The processing module 20 includes a buffer unit 220, a transfer chamber 240, and process chambers 260. The transfer chamber 240 is disposed such that the lengthwise direction thereof is parallel to the first direction 12. The process chambers 260 are disposed on one side and an opposite side of the transfer chamber 240 along the second direction 14. The process chambers 260 located on the one side of the transfer chamber 240 and the process chambers 260 located on the opposite side of the transfer chamber 240 are symmetric to each other with respect to the transfer chamber 240. Some of the process chambers 260 are disposed along the lengthwise direction of the transfer chamber 240. Furthermore, other process chambers 260 are stacked one above another. That is, the process chambers 260 may be disposed in an A×B array (A and B being natural numbers of 1 or larger) on the one side of the transfer chamber 240. Here, "A" denotes the number of process chambers 260 provided in a row along the first direction 12, and "B" denotes the number of process chambers 260 provided in a column along the third direction 16. In a case where four or six process chambers 260 are provided on the one side of the transfer chamber 240, the process chambers 260 may be disposed in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the opposite sides of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) in which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 130 seated on the load ports 120 and the buffer unit 220. An index rail 142 and an index robot 144 are provided in the transfer frame 140. The index rail 142 is disposed such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and index arms 144c. The base 144a is movable along the index rail 142. The body 144b is coupled to the base 144a. The body 144b is movable on the base 144a along the third direction 16. Furthermore, the body 144b is rotatable on the base 144a. The index arms 144c are coupled to the body 144b and are movable forward and backward relative to the body 144b. The index arms 144c are individually driven. The index arms 144c are stacked one above another with a spacing gap therebetween along the third direction 16. Some of the index arms 144c may be used to transfer the substrates W from the processing module 20 to the carriers 130, and the other index arms 144c may be used to transfer the substrates W from the carriers 130 to the processing module 20. Accordingly, particles generated from the substrates W that are to be processed may be prevented from adhering to the processed substrates W in the process in which the index robot 144 transfers the substrates W between the carriers 130 and the processing module 20.

The transfer chamber 240 transfers the substrates W between the buffer unit 220 and the process chambers 260 and between the process chambers 260. A guide rail 242 and a main robot 244 are provided in the transfer chamber 240. The guide rail 242 is disposed such that the lengthwise direction thereof is parallel to the first direction 12. The main robot 244 is installed on the guide rail 242 and rectilinearly moves on the guide rail 242 along the first direction 12. The main robot 244 includes a base 244a, a body 244b, and main arms 244c. The base 244a is movable along the guide rail 242. The body 244b is coupled to the base 244a. The body 244b is movable on the base 244a along the third direction 16. Furthermore, the body 244b is rotatable on the base 244a. The main arms 244c are coupled to the body 244b and are movable forward and backward relative to the body 244b. The main arms 244c are individually driven. The main arms 244c are stacked one above another with a spacing gap therebetween along the third direction 16. The main arms 244c used to transfer the substrates W from the buffer unit 220 to the process chambers 260 may differ from the main arms 244c used to transfer the substrates W from the process chambers 260 to the buffer unit 220.

Substrate processing apparatuses 300 for performing cleaning processes on the substrates W are provided in the process chambers 260, respectively. The substrate processing apparatuses 300 provided in the respective process chambers 260 may have different structures depending on the types of cleaning processes that the substrate processing apparatuses 300 perform. Alternatively, the substrate processing apparatuses 300 in the respective process chambers 260 may have the same structure. Selectively, the process chambers 260 may be divided into a plurality of groups. The substrate processing apparatuses 300 provided in the process chambers 260 belonging to the same group may have the same structure, and the substrate processing apparatuses 300 provided in the process chambers 260 belonging to different groups may have different structures. For example, in a case where the process chambers 260 are divided into two groups, a first group of process chambers 260 may be disposed on the one side of the transfer chamber 240, and a second group of process chambers 260 may be disposed on the opposite side of the transfer chamber 240. Selectively, on the opposite sides of the transfer chamber 240, the first group of process chambers 260 may be disposed in a lower layer, and the second group of process chambers 260 may be disposed in an upper layer. The first group of process chambers 260 and the second group of process chambers 260 may be distinguished from each other depending on the types of chemicals used and the types of cleaning methods.

Figure 2:
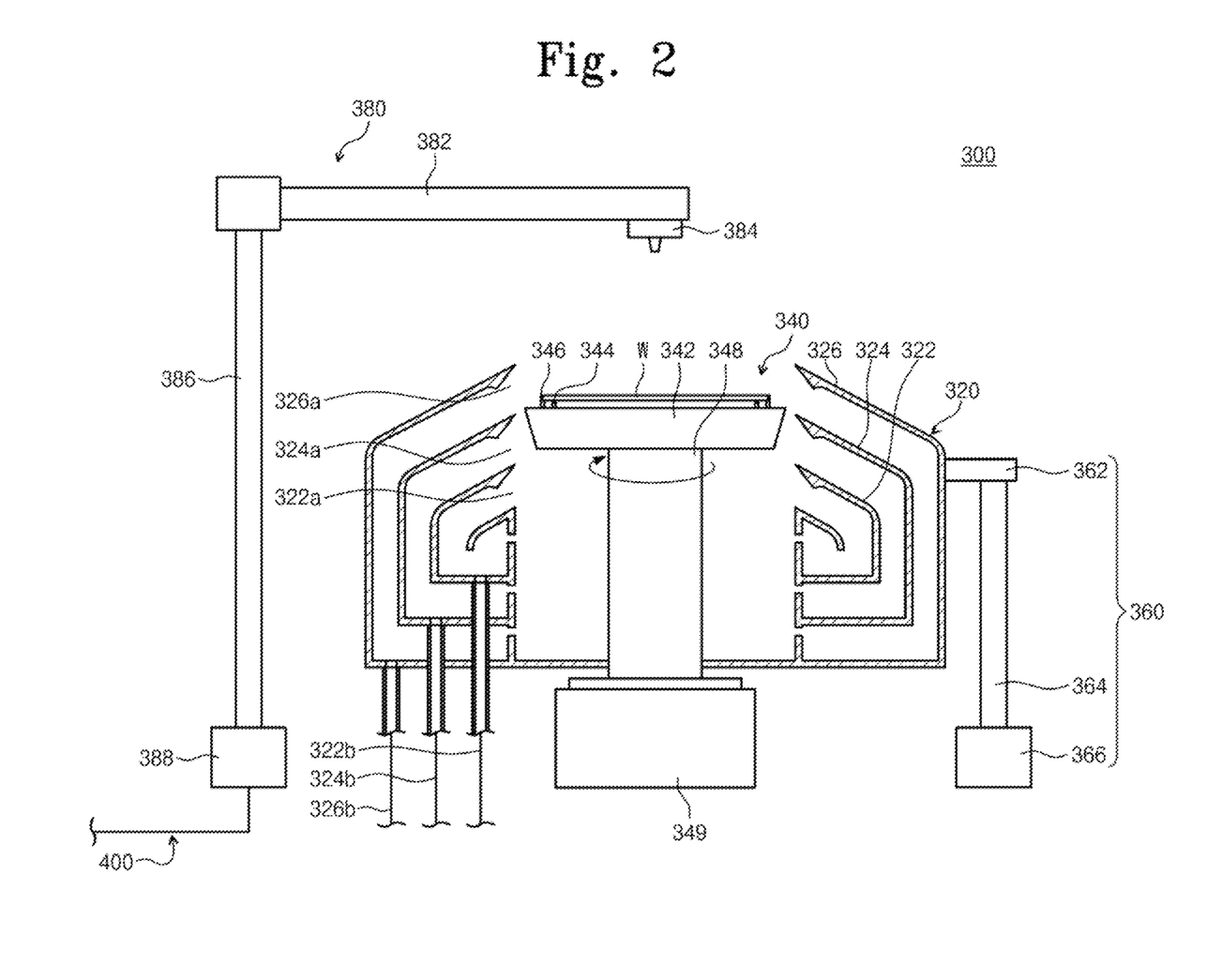
FIG. 2 is a sectional view illustrating one example of substrate processing apparatuses provided in the process chambers of FIG. 1.

Hereinafter, one example of the substrate processing apparatuses 300 that clean the substrates W with processing liquids will be described. FIG. 2 is a sectional view illustrating one example of the substrate processing apparatuses 300. Referring to FIG. 2, the substrate processing apparatus 300 includes a housing 320, a support unit 340, a lifting unit 360, a nozzle unit 380, and a chemical supply unit 400.

The housing 320 provides a space in which substrate processing is performed. The housing 320 is open at the top thereof. The housing 320 has an inner recovery bowl 322, an intermediate recovery bowl 324, and an outer recovery bowl 326. The recovery bowls 322, 324, and 326 recover different processing liquids used for the substrate processing. The inner recovery bowl 322 has an annular ring shape that surrounds the support unit 340. The intermediate recovery bowl 324 has an annular ring shape that surrounds the inner recovery bowl 322. The outer recovery bowl 326 has an annular ring shape that surrounds the intermediate recovery bowl 324. An interior space 322a of the inner recovery bowl 322, a space 324a between the inner recovery bowl 322 and the intermediate recovery bowl 324, and a space 326a between the intermediate recovery bowl 324 and the outer recovery bowl 326 function as inlets through which the processing liquids flow into the inner recovery bowl 322, the intermediate recovery bowl 324, and the outer recovery bowl 326. The recovery bowls 322, 324, and 326 have recovery lines 322b, 324b, and 326b connected thereto, respectively. The recovery lines 322b, 324b, and 326b vertically extend downward from the bottoms of the recovery bowls 322, 324, and 326. The recovery lines 322b, 324b, and 326b drain the processing liquids introduced into the recovery bowls 322, 324, and 326, respectively. The drained processing liquids may be reused through an external processing liquid regeneration system (not illustrated).

The support unit 340 is disposed in the housing 320. The support unit 340 supports and rotates the substrate W during the substrate processing. The support unit 340 includes a body 342, support pins 334, chuck pins 346, and a support shaft 348. The body 342 has an upper surface in a substantially circular shape when viewed from above. The support shaft 348 is fixedly coupled to a bottom surface of the body 342 and is rotatable by a motor 349. The support pins 334 are disposed on an edge portion of the upper surface of the body 334 and are circumferentially spaced apart from each other at predetermined intervals. The support pins 334 protrude upward from the body 342. The support pins 334 are disposed to form an annular ring shape as a whole by a combination thereof. The support pins 334 support an edge region of a rear surface of the substrate W such that the substrate W is spaced apart from the upper surface of the body 342 by a predetermined distance. The chuck pins 346 are disposed farther away from the center of the body 342 than the support pins 344. The chuck pins 346 protrude upward from the body 342. The chuck pins 346 support a lateral portion of the substrate W to prevent the substrate W from deviating from a correct position to a side when the support unit 340 is rotated. The chuck pins 346 are rectilinearly movable between a standby position and a support position along the radial direction of the body 342. The standby position is a position farther away from the center of the body 342 than the support position. The chuck pins 346 are located in the standby position when the substrate W is loaded onto or unloaded from the support unit 340. The chuck pins 346 are located in the support position when the substrate processing is performed. In the support position, the chuck pins 346 are brought into contact with the lateral portion of the substrate W.

The lifting unit 360 rectilinearly moves the housing 320 in an up/down direction. As the housing 320 is moved in the up/down direction, the height of the housing 320 relative to the support unit 340 is changed. The lifting unit 360 includes a bracket 362, a movable shaft 364, and an actuator 366. The bracket 362 is fixedly attached to an outer wall of the housing 320, and the movable shaft 364 is fixedly coupled to the bracket 362 and is moved by the actuator 366 in the up/down direction. The housing 320 is lowered such that the support unit 340 protrudes above the housing 320 when the substrate W is placed on the support unit 340 or raised off the support unit 340. Furthermore, when the substrate processing is performed, the height of the housing 320 is adjusted depending on the types of processing liquids, which are dispensed onto the substrate W, to cause the processing liquids to flow into the preset recovery bowls 322, 324, and 326. For example, while the substrate W is processed with a first processing liquid, the substrate W is located at the height corresponding to the interior space 322a of the inner recovery bowl 322. Furthermore, while the substrate W is processed with a second processing liquid, the substrate W may be located at the height corresponding to the space 324a between the inner recovery bowl 322 and the intermediate recovery bowl 324, and while the substrate W is processed with a third processing liquid, the substrate W may be located at the height corresponding to the space 326a between the intermediate recovery bowl 324 and the outer recovery bowl 326. Unlike that described above, the lifting unit 360 may move the support unit 340 instead of the housing 320 in the up/down direction.

The nozzle unit 380 dispenses a processing liquid onto the substrate W during the substrate processing. The nozzle unit 380 includes a nozzle support rod 382, a nozzle 384, a support shaft 386, and an actuator 388. The support shaft 386 is disposed such that the lengthwise direction thereof is parallel to the third direction 16, and the actuator 388 is coupled to a lower end of the support shaft 386. The actuator 388 rotates, raises, and lowers the support shaft 386. The nozzle support rod 382 is coupled, at a right angle, to an upper end of the support shaft 386 that is opposite to the lower end of the support shaft 386 to which the actuator 388 is coupled. The nozzle 384 is mounted on a bottom surface of a distal end of the nozzle support rod 382. The nozzle 384 is moved between a process position and a standby position by the actuator 388. The process position is a position where the nozzle 384 is located directly above the housing 320, and the standby position is a position where the nozzle 384 deviates from directly above the housing 320.

One or more nozzle units 380 may be provided. In a case where a plurality of nozzle units 380 are provided, a chemical, a rinsing solution, and an organic solvent may be dispensed through the different nozzle units 380. The rinsing solution may be deionized water, and the organic solvent may be a mixture of isopropyl alcohol vapor and inert gas, or an isopropyl alcohol solution.

The chemical supply unit 400 supplies a chemical to the nozzle unit 380. For example, the chemical may be an acidic solution such as hydrofluoric acid, sulfuric acid, nitric acid, phosphoric acid, or the like. Alternatively, the chemical may be an alkaline solution containing potassium hydroxide, sodium hydroxide, ammonium, or the like. In another case, the chemical may be deionized water.

Figure 3:
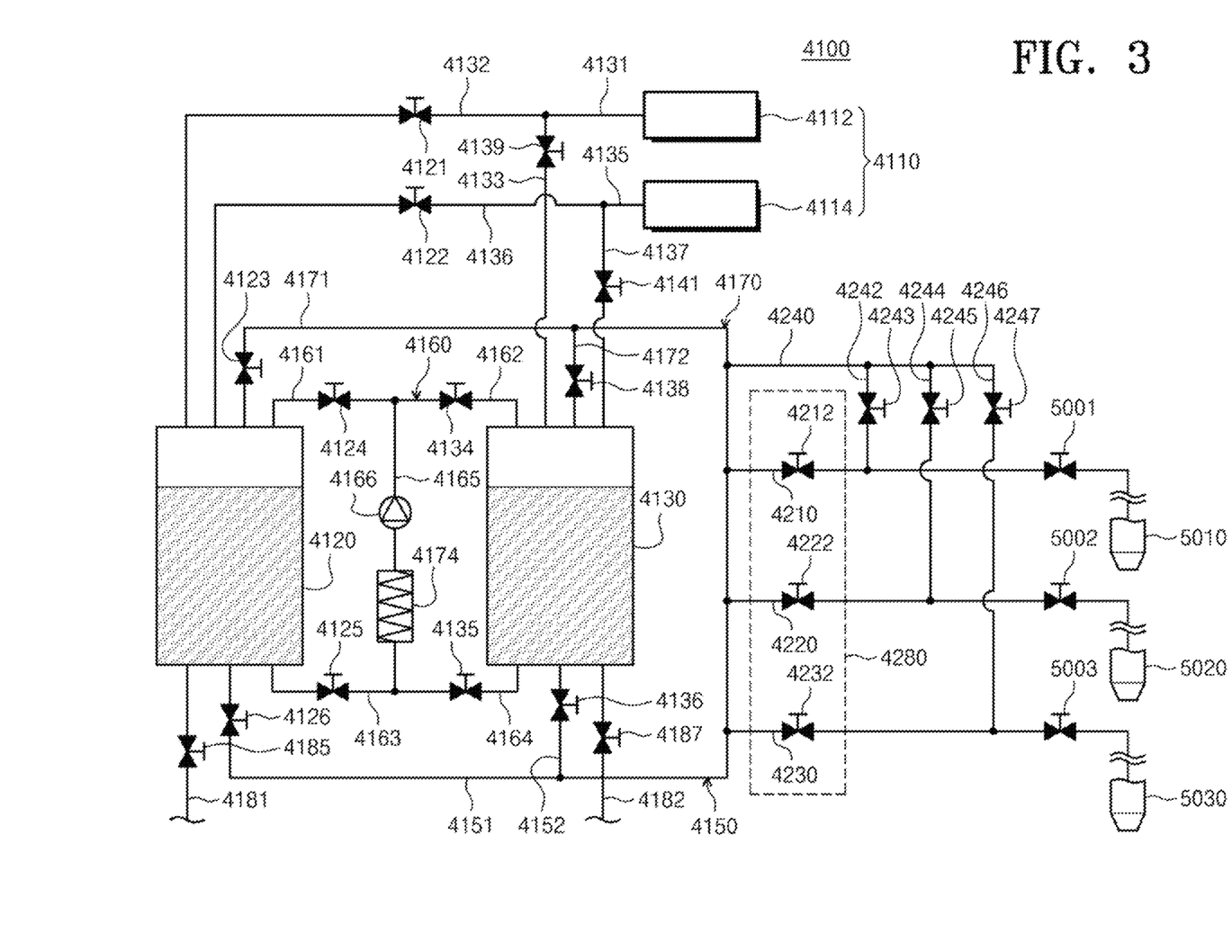
FIG. 3 is a view illustrating a chemical supply unit according to an embodiment of the inventive concept.

Referring to FIG. 3, a chemical supply unit 4100 includes a chemical supply source 4110, a first tank 4120, a second tank 4130, inlet lines 4131 and 4135, an integrated outlet line 4150, drain lines 4181 and 4182, an integrated recovery line 4170, a circulation line 4160, and supply lines 4210, 4220, and 4230.

The chemical supply source 4110 stores a chemical that is used in a process. The chemical supply source 4110 supplies the chemical to the first tank 4120 or the second tank 4130. In an embodiment, the chemical supply source 4110 may include a first chemical supply source 4112 that stores a first chemical and a second chemical supply source 4114 that stores a second chemical.

The first tank 4120 and the second tank 4130 have substantially the same structure. The first tank 4120 and the second tank 4130 store the chemical. While the chemical is supplied from one of the first tank 4120 and the second tank 4130 to objects to be processed, a chemical exchange is performed in the other. In an embodiment, the objects to be processed are substrates that are processed in a plurality of process chambers. For example, one of the objects to be processed is the substrate W illustrated in FIG. 2. In an embodiment, sensors (not illustrated) are installed inside the first tank 4120 and the second tank 4130, respectively. The sensors (not illustrated) detect the remaining amounts of the chemical stored in interior spaces of the tanks 4120 and 4130.

The first chemical and the second chemical supplied from the first chemical supply source 4112 and the second chemical supply source 4114 may be mixed and stored in the first tank 4120 and the second tank 4130. Alternatively, the first tank 4120 may store one of the first chemical and the second chemical, and the second tank 4130 may store the other. In another case, both the first tank 4120 and the second tank 4130 may store only the first chemical, or may store only the second chemical.

The inlet lines 4131 and 4135 may include the first inlet line 4131 and the second inlet line 4135. The first inlet line 4131 includes inlet line 1-1 4132 and inlet line 1-2 4133. The second inlet line 4135 includes inlet line 2-1 4136 and inlet line 2-2 4137.

Inlet line 1-1 4132 connects the first chemical supply source 4112 and the first tank 4120. A first inlet valve 4121 is installed in inlet line 1-1 4132 and regulates the flow rate of the first chemical that is supplied from the first chemical supply source 4112 to the first tank 4120. Inlet line 1-2 4133 connects the first chemical supply source 4112 and the second tank 4130. A second inlet valve 4139 is installed in inlet line 1-2 4133 and regulates the flow rate of the first chemical that is supplied from the first chemical supply source 4112 to the second tank 4130. Inlet line 2-1 4136 connects the second chemical supply source 4114 and the first tank 4120. A third inlet valve 4122 is installed in inlet line 2-1 4136 and regulates the flow rate of the second chemical that is supplied from the second chemical supply source 4114 to the first tank 4120. Inlet line 2-2 4137 connects the second chemical supply source 4114 and the second tank 4130. A fourth inlet valve 4141 is installed in inlet line 2-2 4137 and regulates the flow rate of the second chemical that is supplied from the second chemical supply source 4114 to the second tank 4130.

The integrated outlet line 4150 connects the first tank 4120 and the second tank 4130 to the supply lines 4210, 4220, and 4230. The supply lines 4210, 4220, and 4230 supply the chemical to the objects to be processed. The integrated outlet line 4150 includes a first outlet line 4151 and a second outlet line 4152. The first outlet line 4151 connects the first tank 4120 to the supply lines 4210, 4220, and 4230. A first outlet valve 4126 is installed in the first outlet line 4151 and regulates the flow rate of the chemical that is supplied from the first tank 4120 to the supply lines 4210, 4220, and 4230. The second outlet line 4152 connects the second tank 4130 to the supply lines 4210, 4220, and 4230. A second outlet valve 4136 is installed in the second outlet line 4152 and regulates the flow rate of the chemical that is supplied from the second tank 4130 to the supply lines 4210, 4220, and 4230.

The drain lines 4181 and 4182 include the first drain line 4181 and the second drain line 4182. The first drain line 4181 drains the chemical in the first tank 4120. A first drain valve 4185 is installed in the first drain line 4181 and regulates the flow rate of the chemical that is drained from the first tank 4120. The second drain line 4182 drains the chemical in the second tank 4130. A second drain valve 4187 is installed in the second drain line 4182 and regulates the flow rate of the chemical that is drained from the second tank 4130.

The integrated recovery line 4170 recovers the chemical left after processing of the objects from the supply lines 4210, 4220, and 4230 to the interior space of the first tank 4120 or the second tank 4130. The integrated recovery line 4170 includes a first recovery line 4171 and a second recovery line 4172. The first recovery line 4171 recovers the chemical to the first tank 4120. A first recovery valve 4123 is installed in the first recovery line 4171 and regulates the flow rate of the chemical that is recovered from the supply lines 4210, 4220, and 4230 to the first tank 4120. The second recovery line 4172 recovers the chemical to the second tank 4130. A second recovery valve 4138 is installed in the second recovery line 4172 and regulates the flow rate of the chemical that is recovered from the supply lines 4210, 4220, and 4230 to the second tank 4130.

The circulation line 4160 includes a first line 4161, a second line 4162, a third line 4163, a fourth line 4164, and a shared line 4165. The circulation line 4160 circulates the chemical stored in the interior spaces of the first tank 4120 and the second tank 4130.

The first line 4161 is connected to an upper surface of the first tank 4120. The chemical passing through a heater 4174 and a pressure-reducing member 4166 is introduced into the first tank 4120 through the first line 4161. A first valve 4124 is installed in the first line 4161 and regulates the flow rate of the chemical that is introduced into the first tank 4120 from the shared line 4165. The second line 4162 is connected to an upper surface of the second tank 4130. The chemical passing through the heater 4174 and the pressure-reducing member 4166 is introduced into the second tank 4130 through the second line 4162. A second valve 4134 is installed in the second line 4162 and regulates the flow rate of the chemical that is introduced into the second tank 4130 from the shared line 4165. The third line 4163 is connected to a bottom surface of the first tank 4120. The chemical in the first tank 4120 is released through the third line 4163. A third valve 4125 is installed in the third line 4163 and regulates the flow rate of the chemical that is supplied from the first tank 4120 to the heater 4174. The fourth line 4164 is connected to a bottom surface of the second tank 4130. The chemical stored in the interior space of the second tank 4130 is released through the fourth line 4164. A fourth valve 4135 is installed in the fourth line 4164 and regulates the flow rate of the chemical that is supplied from the second tank 4130 to the heater 4174.

The shared line 4165 connects the first line 4161, the second line 4162, the third line 4163, and the fourth line 4164. The chemical passing through the shared line 4165 flows back into the first tank 4120 through the first line 4161, or flows back into the second tank 4130 through the second line 4162.

Likewise, the chemical stored in the interior space of the first tank 4120 circulates through the first line 4161, the shared line 4165, and the third line 4163. The chemical in the second tank 4130 circulates through the second line 4162, the shared line 4165, and the fourth line 4164.

The circulation line 4160 includes the pressure-reducing member 4166 and the heater 4174. The pressure-reducing member 4166 adjusts the supply flow rate of the chemical by controlling a stroke per minute. The heater 4174 adjusts the temperature of the chemical.

The supply lines 4210, 4220, and 4230 supply the chemical to a plurality of chambers. The chambers include nozzles 5010, 5020, and 5030, respectively. The nozzles 5010, 5020, and 5030 dispense the chemical onto the objects to be processed. For example, the chemical is dispensed through the nozzle 5020 onto the object to be processed. A distributor 4280 is installed on the supply lines 4210, 4220, and 4230. The supply lines 4210, 4220, and 4230 include the first supply line 4210, the second supply line 4220, and the third supply line 4230 that are connected to the respective chambers. Valves 4212, 4222, and 4232 are installed in the respective supply lines 4210, 4220, and 4230 and regulate the flow rates of the chemical that is supplied into the chambers.

Return lines 4242, 4244, and 4246 are connected to the supply lines 4210, 4220, and 4230, respectively. The return lines 4242, 4244, and 4246 are connected to an integrated return line 4240 and return the chemical left in the supply lines 4210, 4220, and 4230 to the integrated recovery line 4170. Valves 4243, 4245, and 4247 are installed in the respective return lines 4242, 4244, and 4246 and regulate the flow rates of the chemical that returns to the integrated recovery line 4170.

Hereinafter, a substrate processing method of the inventive concept will be described with reference to FIGS. 4 to 10. A controller controls the chemical supply unit 4100 to perform the substrate processing method of the inventive concept. FIGS. 4 to 10 are views sequentially illustrating the substrate processing method using the chemical supply unit according to the inventive concept. Arrows represent chemical flows. As used herein, valves that are shaded are an indication that the valves are in a closed position, while valves that are not shaded are an indication that the valves are in an open position.

Figure 4:
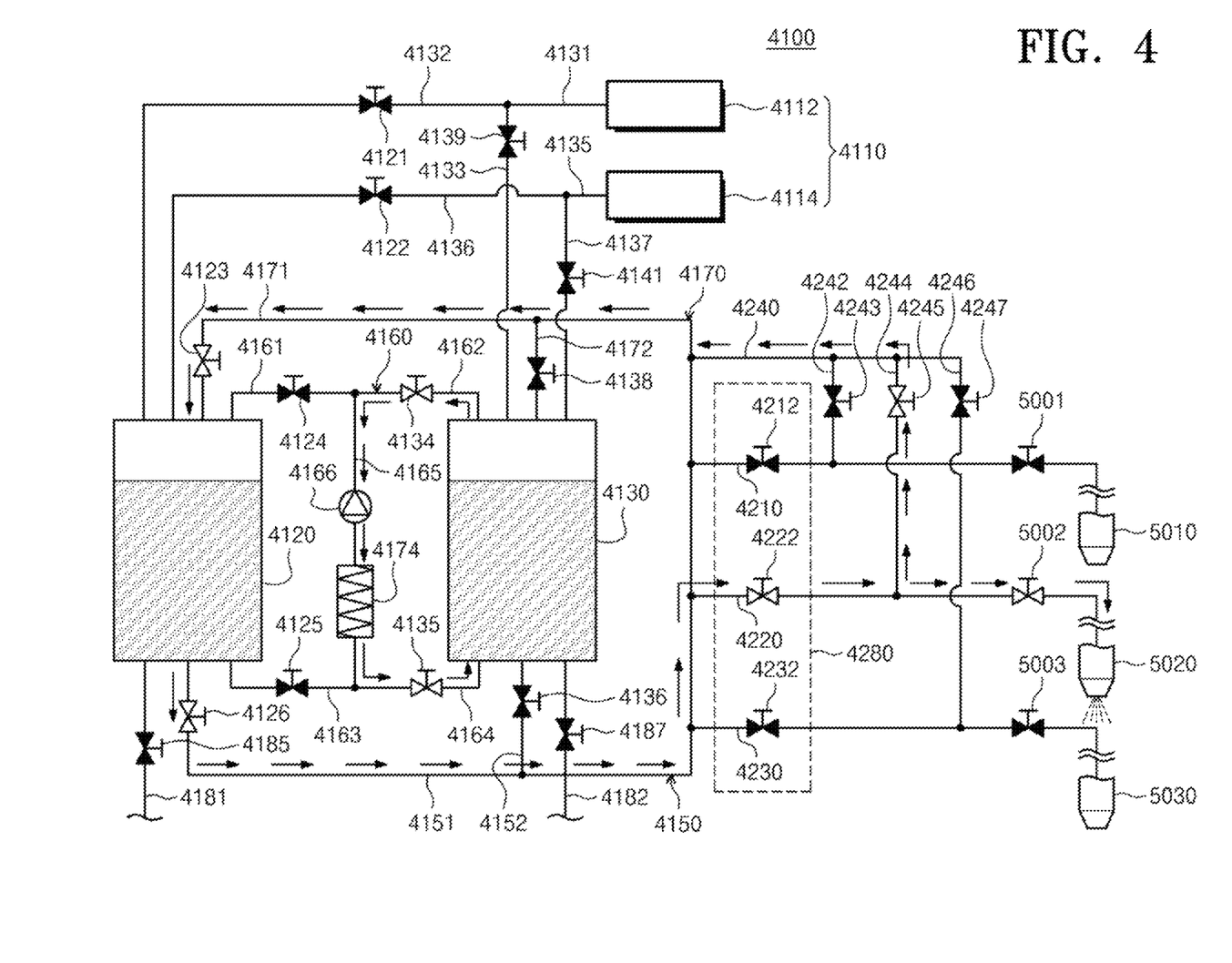
FIGS. 4 to 10 are views sequentially illustrating a method for processing a substrate using the chemical supply unit according to an embodiment of the inventive concept.

First, as illustrated in FIG. 4, the chemical is supplied from the interior space of the first tank 4120 to the nozzle 5020. Selectively, the chemical may be recovered into the interior space of the first tank 4120. During this process, the chemical stored in the second tank 4130 circulates through the circulation line 4160.

Figure 5:
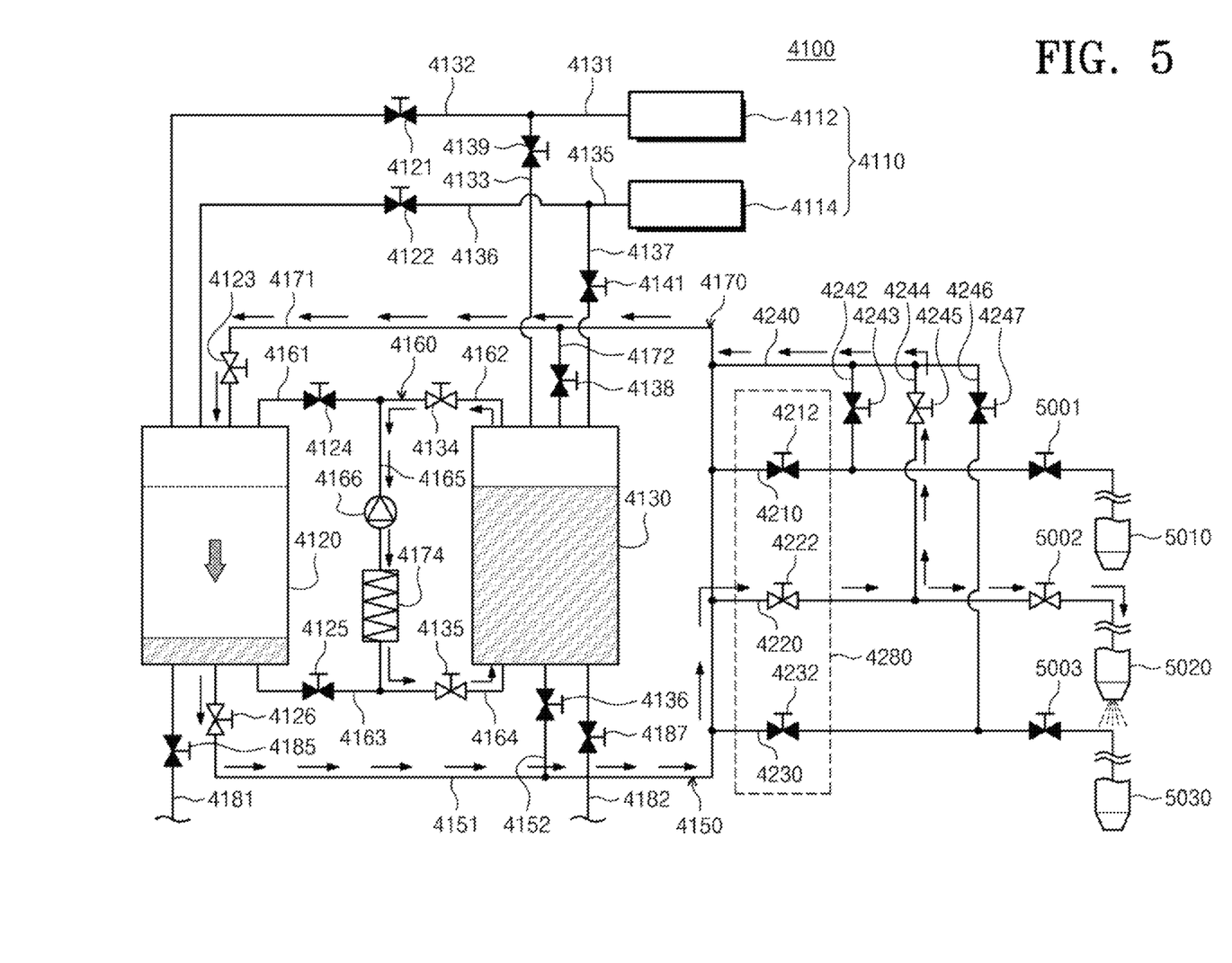
Figure 6:
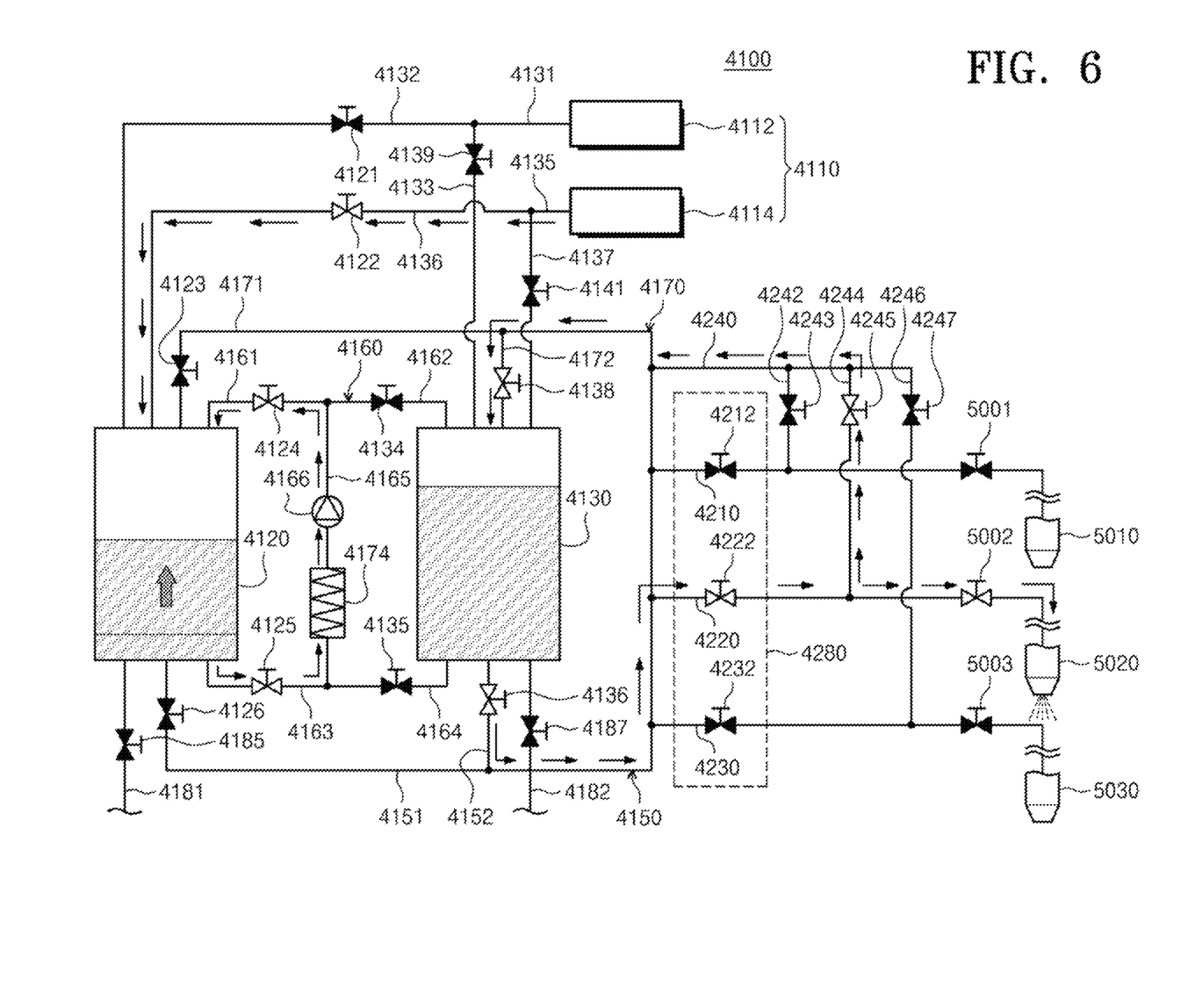

As the chemical is supplied from the first tank 4120 to the nozzle 5020, the level of the chemical in the first tank 4120 is gradually lowered as illustrated in FIG. 5. When the remaining amount of the chemical in the interior space of the first tank 4120 reaches a preset chemical amount or less, a new chemical, as illustrated in FIG. 6, is supplied into the first tank 4120 and mixed with the chemical remaining in the first tank 4120. In an embodiment, the preset chemical amount may be set to 5% to 15% of a chemical amount that the first tank 4120 can store.

In the process in which the new chemical is mixed with the remaining chemical in the first tank 4120, the chemical in the interior space of the second tank 4130 is supplied to the nozzle 5020. Selectively, the chemical is recovered into the interior space of the second tank 4130. Accordingly, the chemical continues to be dispensed onto the object to be processed without stopping. During this process, the chemical stored in the first tank 4120 circulates through the circulation line 4160.

Figure 7:
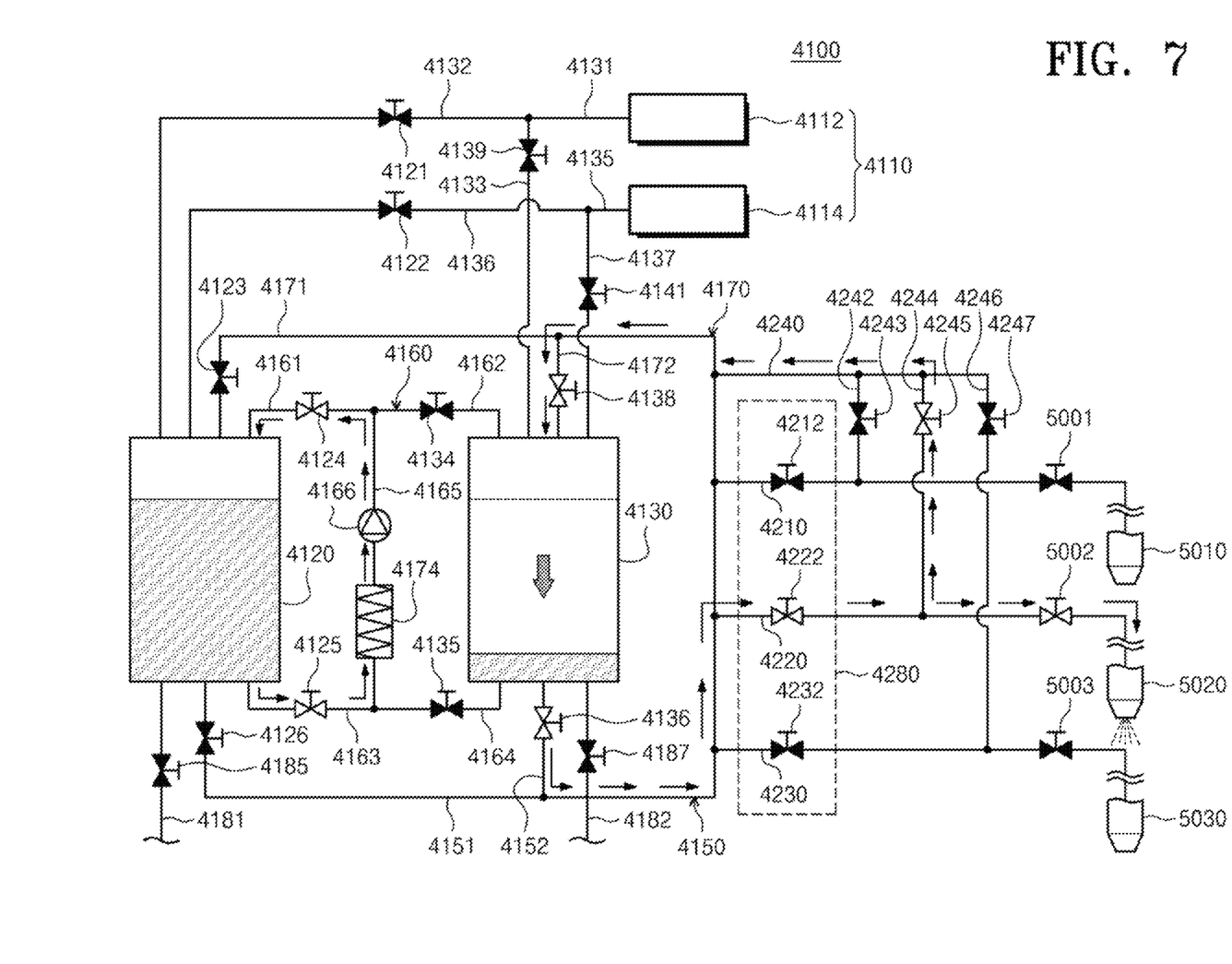
Figure 8:
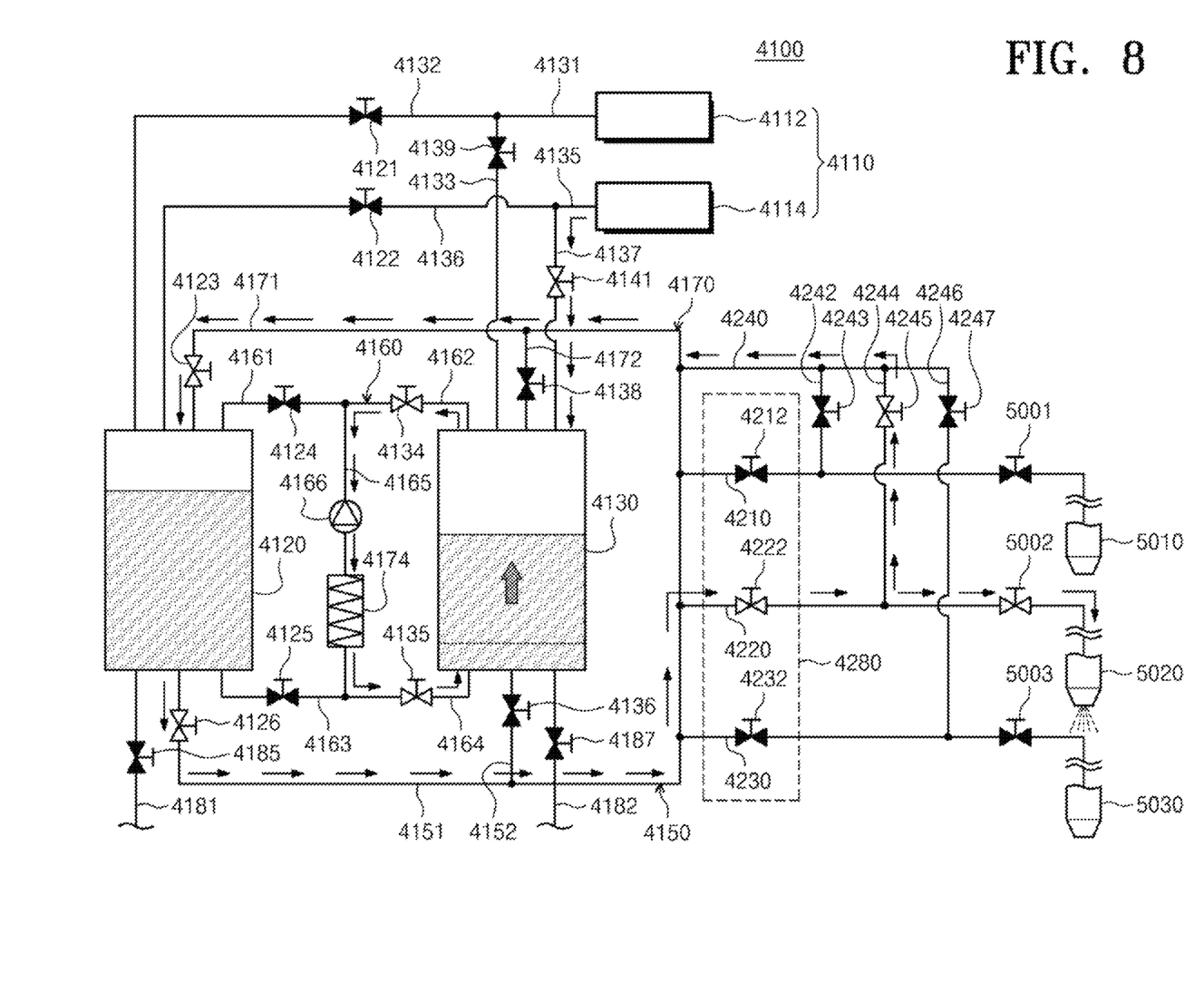

As the chemical is supplied from the second tank 4130 to the nozzle 5020, the level of the chemical in the second tank 4130 is gradually lowered as illustrated in FIG. 7. Likewise, when the remaining amount of the chemical in the interior space of the second tank 4130 reaches the preset chemical amount or less, a new chemical, as illustrated in FIG. 8, is supplied into the second tank 4130 and mixed with the chemical remaining in the second tank 4130.

In the process in which the new chemical is mixed with the remaining chemical in the second tank 4130, the chemical in the interior space of the first tank 4120 is supplied to the nozzle 5020. Selectively, the chemical is recovered into the interior space of the first tank 4120. Accordingly, the chemical continues to be supplied to the nozzle 5020 without stopping. During this process, the chemical stored in the second tank 4130 circulates through the circulation line 4160.

The above-described processes are repeatedly performed. For example, the mixture of the remaining chemical in each tank and the new chemical supplied into the tank is performed N times.

Figure 9:
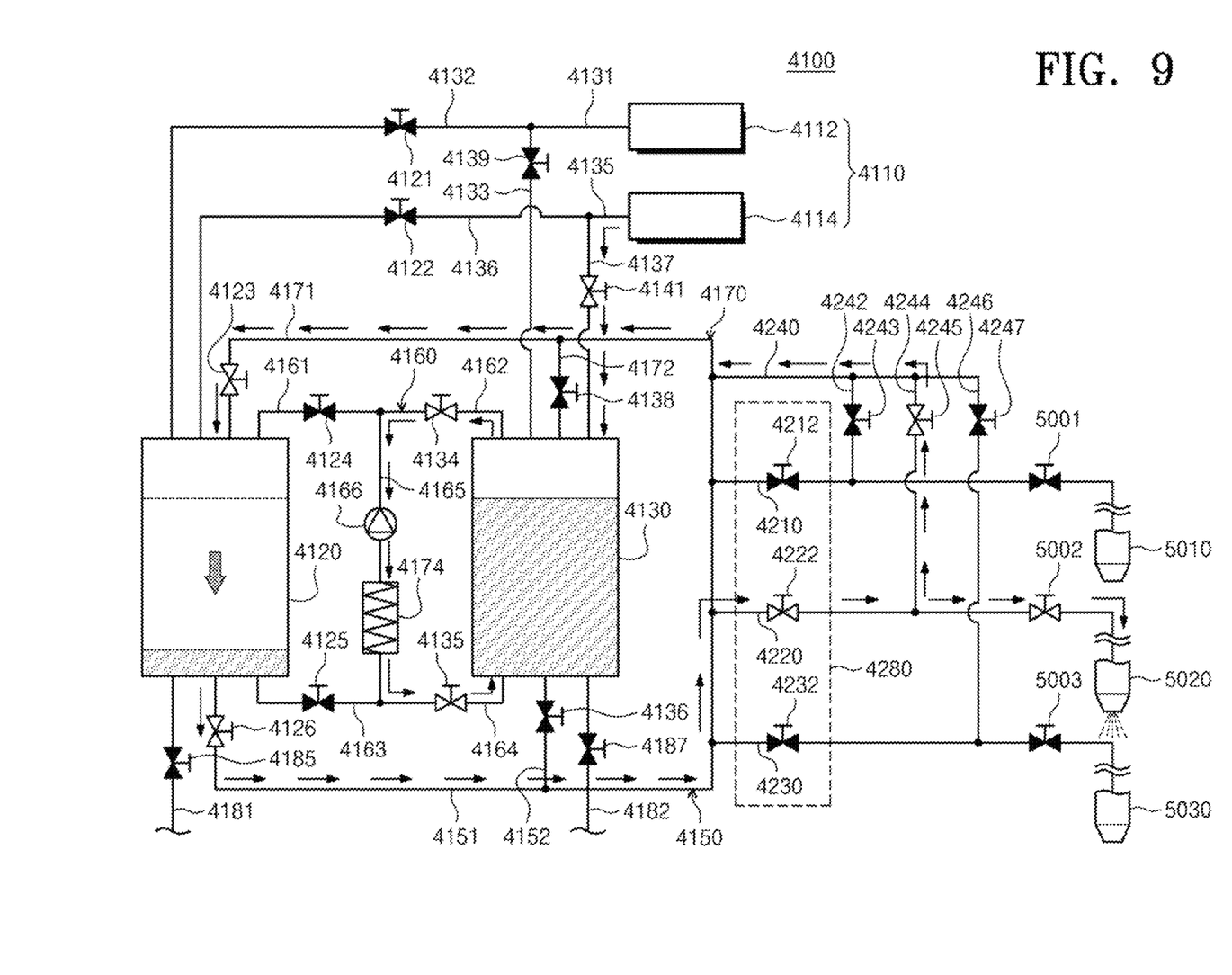
Figure 10:
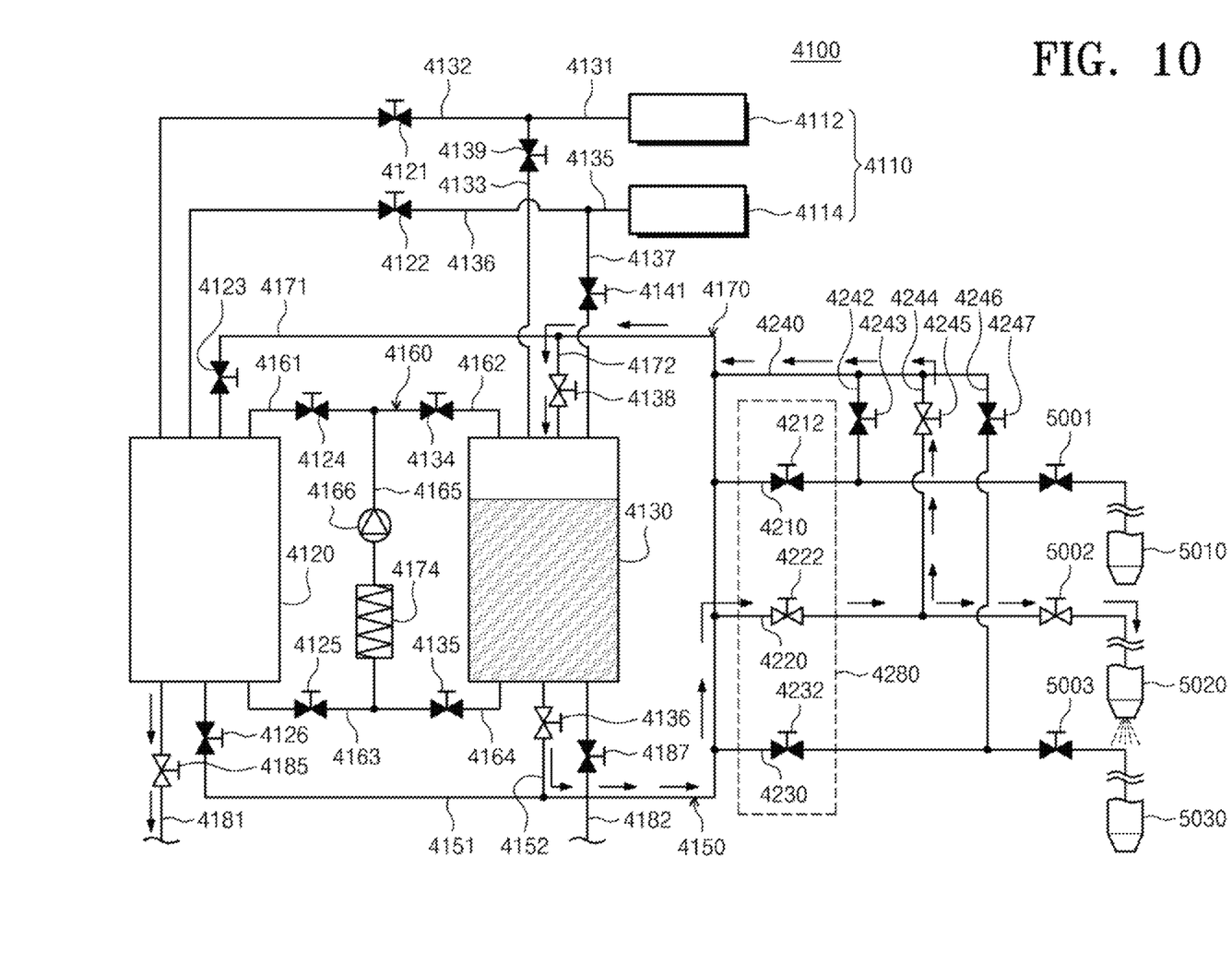

Thereafter, the chemical in the first tank 4120 is supplied to the nozzle 5020, and accordingly, the level of the chemical in the first tank 4120 is gradually lowered as illustrated in FIG. 9. In this case, the first tank 4120 is completely emptied as illustrated in FIG. 10 if the mixture of the remaining chemical in the first tank 4120 and the new chemical supplied into the first tank 4120 has already been performed N times.

According to the inventive concept, when a substrate is processed with a chemical stored in a tank, a waste of the chemical may be reduced by mixing a new chemical with the chemical that remains at a preset level or lower in the tank, without completely draining the remaining chemical.

According to the inventive concept, contamination of a chemical may be prevented by limiting the number of times that mixture of a remaining chemical in each tank and a new chemical supplied into the tank is performed.

According to the embodiments of the inventive concept, the amount of a chemical unnecessarily drained from the chemical supply unit may be reduced.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a housing having a processing space in which the substrate is processed;
   a support unit configured to support the substrate in the processing space;
   a nozzle configured to dispense a chemical onto the substrate placed on the support unit;
   a chemical supply unit configured to supply the chemical to the nozzle; and a controller configured to control the chemical supply unit, wherein the chemical supply unit includes:
- a tank having an interior space in which the chemical is stored;
- a sensor configured to detect a remaining amount of the chemical stored in the interior space of the tank;
- an inlet line through which the chemical is supplied from a chemical supply source to the interior space of the tank and in which an inlet valve is installed;
- an outlet line through which the chemical is supplied from the interior space of the tank to the nozzle and in which an outlet valve is installed; and
- a drain line through which the chemical in the interior space of the tank is drained and in which a drain valve is installed, wherein the controller controls the chemical supply unit to supply a new chemical from the chemical supply source to the tank in a state in which the chemical remains in the interior space of the tank, when the remaining amount detected by the sensor reaches a first preset amount or less, wherein the tank includes a first tank and a second tank, and wherein the chemical supply unit further includes a circulation line configured to circulate the chemical stored in one of the first tank and the second tank when an other one of the first tank and the second tank receives the chemical from the chemical supply source through the inlet line, supplies the chemical to the nozzle through the outlet line, or drains the chemical through the drain line.

2. The apparatus of claim 1, wherein the controller:
- determines whether a number of times that the chemical remaining in the tank and the new chemical supplied to the tank are mixed with each other exceeds a preset number of times; and
- controls the chemical supply unit to drain the remaining chemical in the interior space of the tank through the drain line, when the number of times that the chemical remaining in the tank and the new chemical supplied to the tank are mixed with each other exceeds the preset number of times and the remaining amount detected by the sensor reaches a second preset amount or less.

3. The apparatus of claim 2, wherein the first preset amount is equal to the second preset amount.

4. The apparatus of claim 3, wherein the first preset amount is set to 5% to 15% of a chemical amount that the tank is able to store.

5. The apparatus of claim 1, wherein the circulation line includes:
- a heater configured to heat the chemical flowing through the circulation line; and
- a pressure-reducing member configured to deliver the chemical stored in the first tank or the second tank to the heater.

6. A chemical supply unit for supplying a chemical, the chemical supply unit comprising:
- a tank having an interior space in which the chemical is stored;
- a sensor configured to detect a remaining amount of the chemical stored in the interior space of the tank;
- an inlet line through which the chemical is supplied from a chemical supply source to the interior space of the tank and in which an inlet valve is installed;
- an outlet line through which the chemical is supplied from the interior space of the tank to an object to be processed and in which an outlet valve is installed;
- a drain line through which the chemical in the interior space of the tank is drained and in which a drain valve is installed; and
- a controller configured to control the chemical supply unit, wherein the controller controls the chemical supply unit to supply a new chemical from the chemical supply source to the tank in a state in which the chemical remains in the interior space of the tank, when the remaining amount detected by the sensor reaches a first preset amount or less, wherein the tank includes a first tank and a second tank, and wherein the chemical supply unit further comprises a circulation line configured to circulate the chemical stored in one of the first tank and the second tank when an other one of the first tank and the second tank receives the chemical from the chemical supply source through the inlet line, supplies the chemical through the outlet line to the object to be processed, or drains the chemical through the drain line.

7. The chemical supply unit of claim 6, wherein the controller:
- determines whether a number of times that the chemical remaining in the tank and the new chemical supplied to the tank are mixed with each other exceeds a preset number of times; and
- controls the chemical supply unit to drain the remaining chemical in the interior space of the tank through the drain line, when the number of times that the chemical remaining in the tank and the new chemical supplied to the tank are mixed with each other exceeds the preset number of times and the remaining amount detected by the sensor reaches a second preset amount or less.

8. The chemical supply unit of claim 7, wherein the first preset amount is equal to the second preset amount.

9. The chemical supply unit of claim 8, wherein the first preset amount is set to 5% to 15% of a chemical amount that the tank is able to store.

10. The chemical supply unit of claim 6, wherein the circulation line includes:
- a heater configured to heat the chemical flowing through the circulation line; and
- a pressure-reducing member configured to deliver the chemical stored in the first tank or the second tank to the heater.

* * * * *